United States Patent [19]
Lin et al.

[11] Patent Number: 5,428,245
[45] Date of Patent: Jun. 27, 1995

[54] LEAD FRAME INCLUDING AN INDUCTOR OR OTHER SUCH MAGNETIC COMPONENT

[75] Inventors: Peng-Cheng Lin, Cupertino; Seth R. Sanders, Berkeley; Hem P. Takiar, Fremont, all of Calif.

[73] Assignee: National Semiconductor Corporation, Santa Clara, Calif.

[21] Appl. No.: 239,346

[22] Filed: May 6, 1994

[51] Int. Cl.⁶ .............................................. H01L 23/48
[52] U.S. Cl. ................... 257/666; 257/676; 257/924
[58] Field of Search ................ 257/531, 924, 666, 676

[56] References Cited

U.S. PATENT DOCUMENTS 4,064,472  12/1977  Gunewardena et al. ............. 336/65

FOREIGN PATENT DOCUMENTS 60-225449  11/1985  Japan ................................... 257/531

*Primary Examiner*—William Mintel
*Assistant Examiner*—Roy Potter
*Attorney, Agent, or Firm*—Hickman & Beyer

[57] ABSTRACT

A lead frame for use in an integrated circuit package is disclosed herein. The lead frame includes a magnetic component winding wherein the winding is formed as an integral part of the lead frame. Additional windings may be formed as an integral part of the lead frame and then folded into position over the first winding to form a multiple layered magnetic component winding. In one embodiment, the lead frame based winding is coated with a magnetic material to form a lead frame based inductor. There is also disclosed a method of producing a lead frame including a magnetic component winding wherein the winding is formed as an integral part of the lead frame.

15 Claims, 3 Drawing Sheets

LEAD FRAME INCLUDING AN INDUCTOR OR OTHER SUCH MAGNETIC COMPONENT

BACKGROUND OF THE INVENTION

The present invention relates generally to lead frames for use in integrated circuit packaging and more particularly, to a lead frame including a specifically constructed magnetic component, such as an inductor or transformer.

In integrated circuit packaging, a lead frame is used to support an integrated circuit within an integrated circuit package as well as provide electrically conductive leads for the connection of the integrated circuit to other circuit elements outside the package. In several types of circuits, it is desirable to provide a magnetic component in association with the integrated circuit. To date, the magnetic component, for example an inductor or transformer, has been formed as part of the integrated circuit or provided as a discrete component formed for use in surface mount or through hole circuit fabrication. Both of these approaches have certain limitations.

U.S. Pat. No. 5,070,317 discloses a magnetic device which may be incorporated into an integrated circuit. However, this approach has definite limitations. For instance, in the case of an inductor, the physical size of the integrated circuit limits the inductor to a relatively low inductance. Similar limitations apply to other magnetic devices. Therefore, in situations where a higher inductance or larger magnetic component is required, the magnetic component must be provided external to the integrated circuit.

There are many situations where larger magnetic components are required or where, for some other reason, it is not desirable to incorporate the magnetic device into the integrated circuit. In these situations, the magnetic component is typically provided in the form of a discrete component formed for use in surface mount or through hole circuit fabrication. This approach to providing a magnetic component associated with the integrated circuit also has some disadvantages. In some situations, the circuit may call for a component for which an off the shelf component is not readily available. Under these circumstances, a more costly custom component is required. Also, it is often desirable to include the magnetic device in the integrated circuit package. The present invention provides an integrated circuit package wherein the package includes a customized magnetic component that is produced, in part, along with and as a component of the lead frame of the package.

SUMMARY OF THE INVENTION

As will be described in more detail hereinafter, a lead frame for use in an integrated circuit package is disclosed. The lead frame includes a magnetic component winding, for example an inductor or transformer winding, wherein the winding is formed as an integral part of the lead frame. Additional windings may be formed as an integral part of the lead frame and then folded into a position over the first winding to form a multiple layered magnetic component winding. In one embodiment of the present invention the lead frame based winding is coated with a magnetic material to form a lead frame based inductor.

There is also disclosed a method of producing a lead frame in accordance with the present invention. The method includes the step of forming a lead frame and magnetic component winding from an electrically conductive material wherein the magnetic component winding is formed as part of the lead frame. The process of forming the lead frame may be, for example, the process of stamping or etching the lead frame and winding from a sheet of rolled copper.

BRIEF DESCRIPTION OF THE DRAWINGS

The present invention may best be understood by reference to the following description taken in conjunction with the accompanying drawings in which.

DETAILED DESCRIPTION OF THE INVENTION

Figure 1:
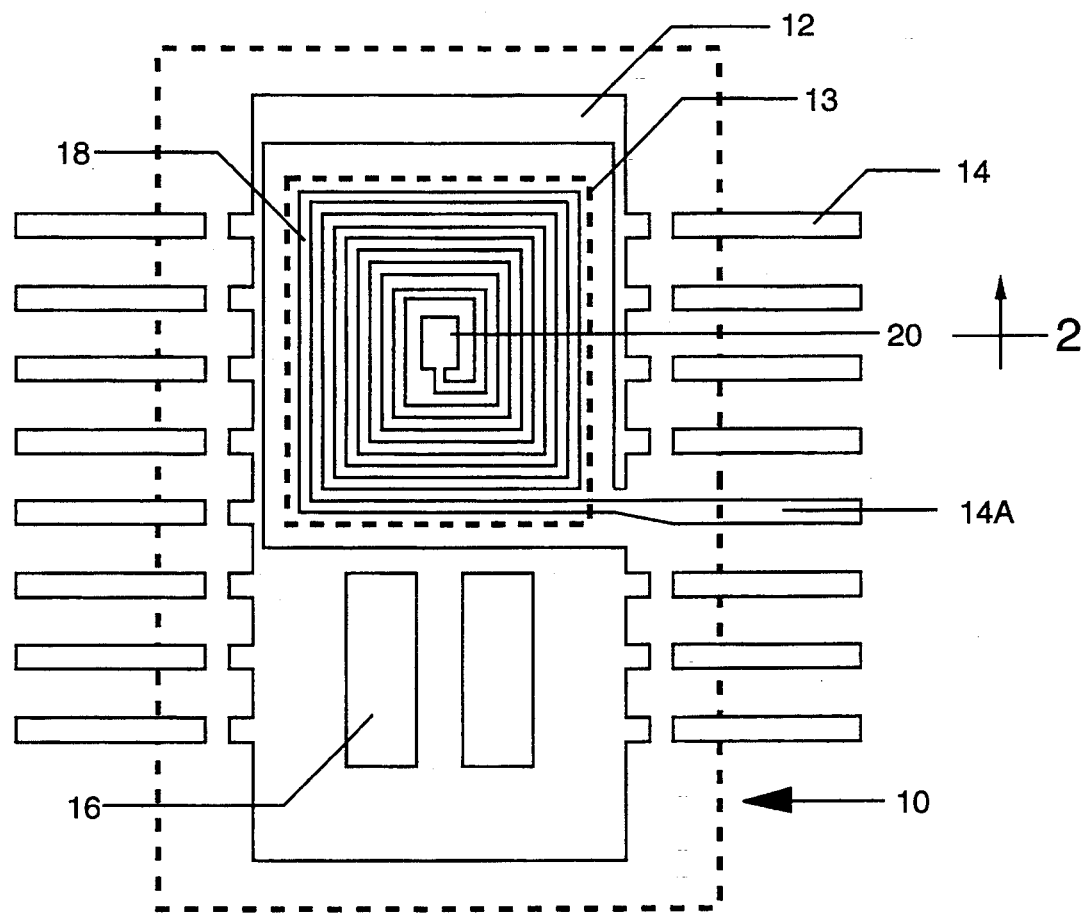
FIG. 1 is a diagrammatic plan view of an integrated circuit package including a lead frame based inductor in accordance with the present invention.
Figure 2:
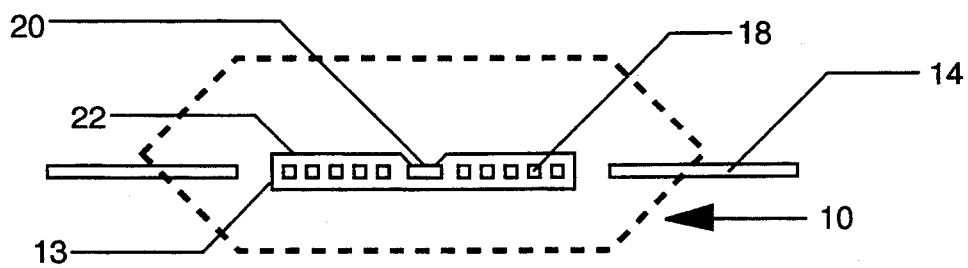
FIG. 2 is a diagrammatic cross sectional view of the integrated circuit package shown in FIG. 1.

Referring initially to FIGS. 1 and 2, an integrated circuit package designed in accordance with the present invention and generally designated by the reference numeral 10 will be described. In this first embodiment, the integrated circuit package includes a lead frame 12 and a lead frame based inductor 13.

The integrated circuit package 10 supports lead frame 12 which is either stamped or etched from a sheet of electrically conductive material. Lead frame 12 includes an array of electrically conductive leads 14. Lead frame 12 also includes one or more component attach pads, one of which is indicated by attach pad 16, wherein the attach pads are adapted to support various components such as an integrated circuit. In accordance with the present invention, an inductor winding 18, which comprises part of overall inductor 13, is formed as an integral part of lead frame 12. In this example, the winding has a coil shape wherein the outermost point of the winding connects to a particular lead 14A. The windings innermost point forms a terminal point 20 which allows the winding to be electrically connected to other components of integrated circuit package 10 during the package fabrication process.

Figure 3:
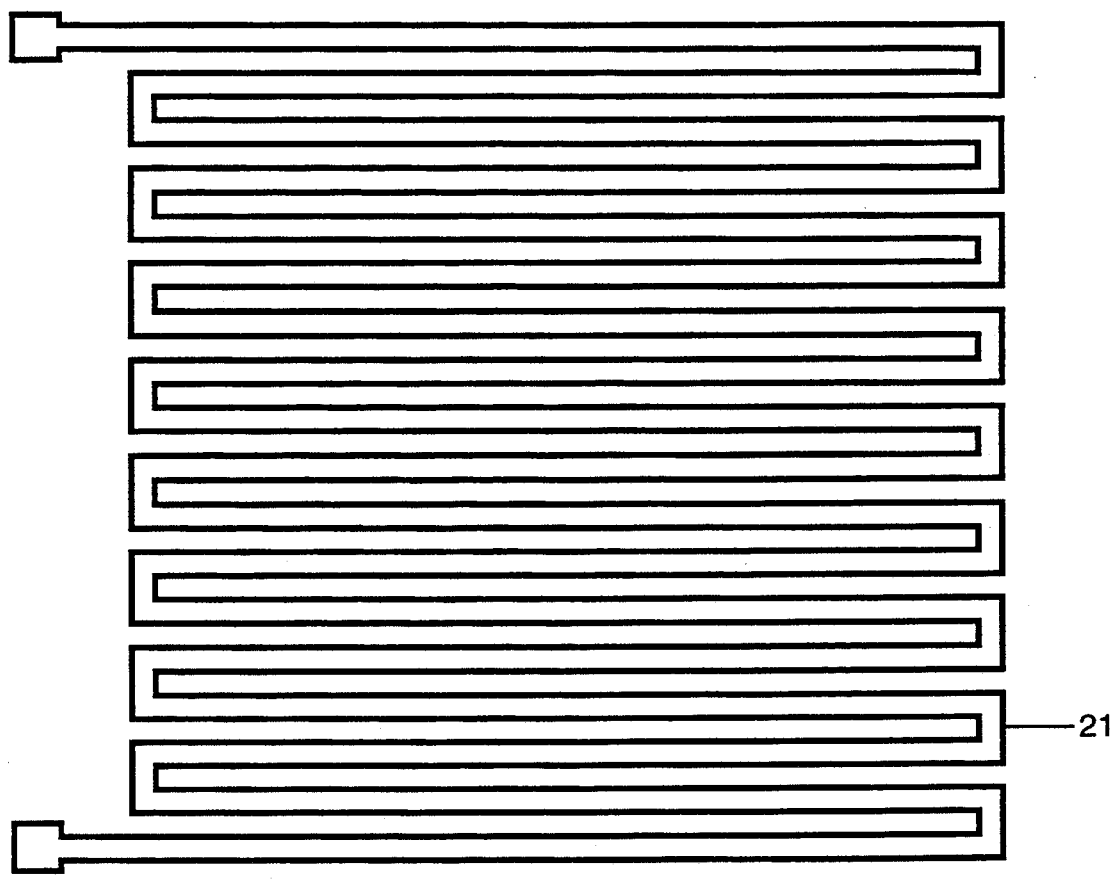
FIG. 3 is a diagrammatic plan view of an alternative zig-zag shape winding for an inductor in accordance with the present invention.

In this first embodiment the winding has a coil shape. FIG. 3 illustrates an alternative zig-zag shaped winding 21. Other embodiments may have a variety of other shapes depending on the requirements of the application and the type of magnetic device being produced. Also, this example has the winding's outermost point connected to lead 14A and its innermost point forming a terminal to be electrically connected to other components within the package. It should be understood that these points may be arranged and connected in a wide variety of ways, again depending on the requirements of the application and the type of magnetic component being produced.

Referring back to FIG. 2, a magnetic coating 22 surrounds inductor winding 18, forming inductor 13. A small opening is formed in the coating material to allow terminal point 20 to be electrically connected to other components within integrated circuit package 10. In this embodiment, the coating is an epoxy mixed with a magnetic filler such as iron powder. However, the coating may be provided as formed halves which sandwich the winding or a variety of other such arrangements which would form a magnetic coating around the winding.

Because the winding 18 is formed as part of the lead frame as described above, no extra cost or additional process steps are required for making the winding. Also, the process of applying an epoxy coating to the winding may be done using the existing package assembly process equipment and process procedures. Therefore, a lead frame based inductor or other magnetic component may be provided at a significant cost savings compared to using a discrete component for a given situation. The component may also be customized to provide the exact electrical requirements of the package.

Figure 4:
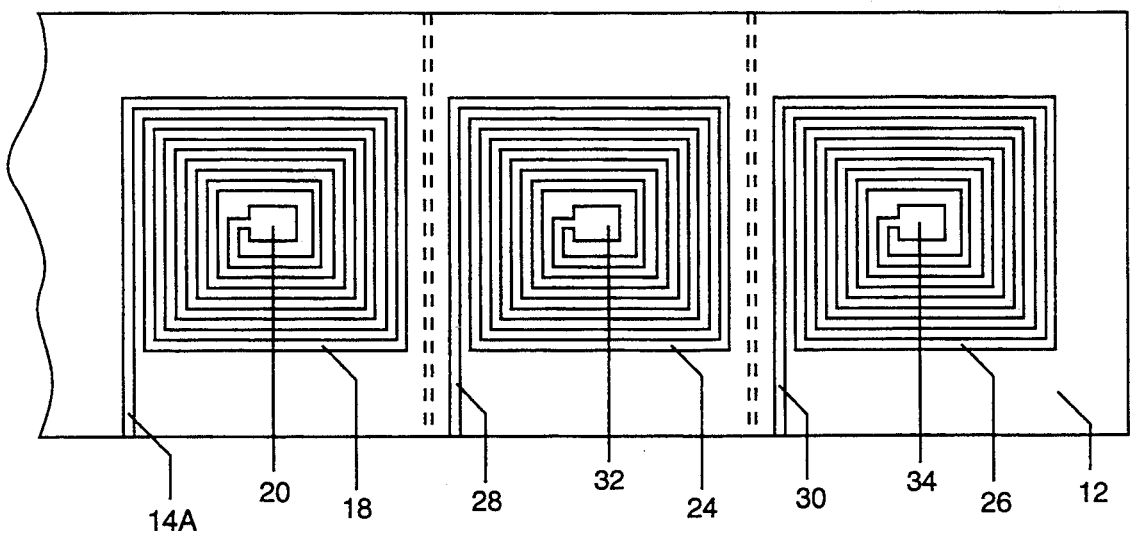
FIG. 4 is a partially broken away plan view of the individual layers of windings of a multiple layered lead frame based inductor in accordance with the present invention before the layers of windings are bent into their final position.
Figure 5:
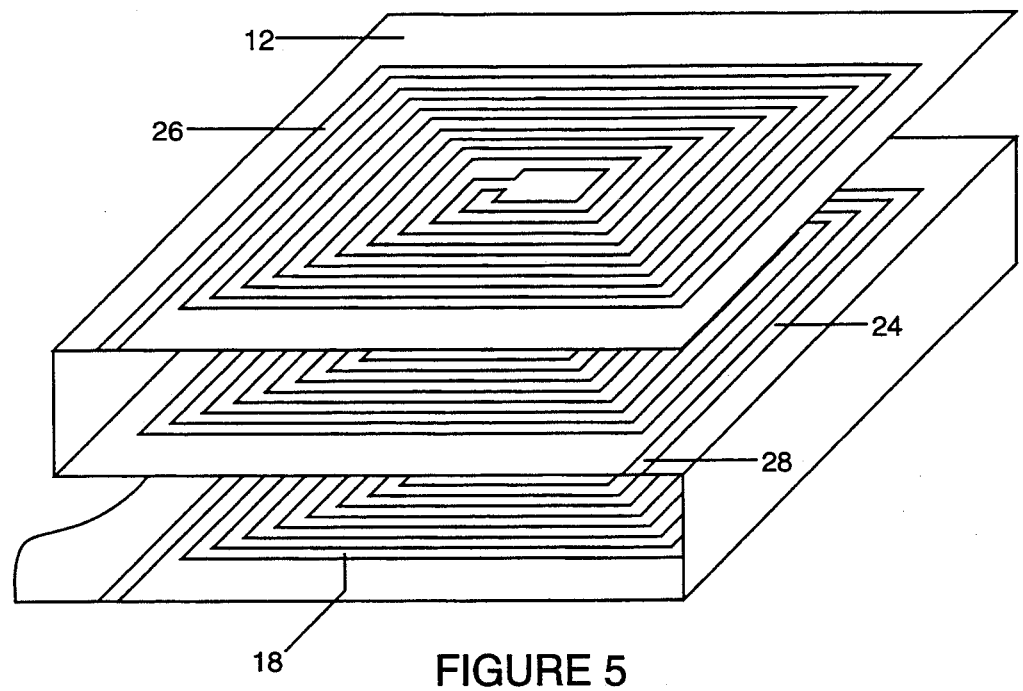
FIG. 5 is a partially broken away perspective view of the multiple layered lead frame based inductor shown in FIG. 4 after the layers of windings are bent into their final position.

A second embodiment of the present invention is illustrated in FIGS. 4 and 5. In this embodiment, three layers of inductor winding are provided. A first inductor winding 18 is formed as part of lead frame 12 in the same way as was described above. However, in this second embodiment of the present invention, a second winding 24 and a third winding 26 are also formed as an integral part of lead frame 12. As shown in FIG. 4, winding 24 is formed adjacent to winding 18 and winding 26 is formed adjacent to winding 24. Windings 24 and 26 both have a coil shape and include terminal pads 28 and 30 at their respective outermost points and terminal pads 32 and 34 at their respective innermost points.

As shown in FIG. 5, the portion of lead frame 12 which includes windings 24 and 26 is folded over winding 18 to position winding 24 directly above and in parallel planes with winding 18. The portion of lead frame 12 which includes winding 26 is then folded over winding 24 to position winding 26 directly above and in parallel planes with both windings 18 and 24. Using, for example, the wire bonding technique typically used in the manufacture of an integrated circuit, terminal pad 20 of winding 18 is electrically connected to pad 32 of winding 24 and pad 28 of winding 24 is electrically connected to pad 30 of winding 26. A magnetic coating, not shown, surrounds inductor windings 18, 24, and 26 forming an inductor. A small opening is formed in the magnetic coating at terminal pad 34 to allow pad 34 to be electrically connected to other components within the integrated circuit package. This embodiment has windings 18, 24, and 26 electrically connected in series. Alternatively, the windings may be connected in parallel depending on the electrical requirements of the application. Also, this embodiment has windings 18, 24, and 26 all formed as an integral part of the leadframe. Alternatively, each of the windings may be formed from independent sheets of material and then stacked to form a multiple layered magnetic device.

Although the above described embodiment only utilizes three layers of windings, it should be understood that the present invention is not limited to three layers. The number of layers is limited only by the space available in the integrated circuit package that is being used. Also, as mentioned above, the windings may have a variety of shapes and are not limited to the coil shape described.

This same approach may be used to form multiple layered windings for other magnetic components such as transformers and magnetic switches. In the case of a transformer, for example, a first winding layer may provide the primary winding and a second winding layer may provide the secondary winding.

Although only two embodiments of the present invention have been described in detail, it should be understood that the present invention may be embodied in many other specific forms without departing from the spirit or scope of the invention. Particularly, the magnetic component is not limited to inductors. The present invention would also apply to other magnetic components which utilize windings such as, but not limited to, transformers and magnetic switches.

Therefore, the present examples are to be considered as illustrative and not restrictive, and the invention is not to be limited to the details given herein, but may be modified within the scope of the appended claims.

What is claimed is:

1. A lead frame for use in an integrated circuit package comprising;
   (a) a unitary main body adapted to support an integrated circuit within said integrated circuit package,
   (b) an array of electrically conductive leads positioned in close proximity to said main body for electrically connecting said integrated circuit to other elements, and
   (c) a magnetic component winding integrally forming part of the unitary main body of said lead frame.

2. A lead frame as set forth in claim 1 further comprising additional windings integrally formed with and as part of the main body of said lead frame wherein said windings are stacked in parallel planes forming a multiple layered winding.

3. A lead frame as set forth in claim 1 wherein said magnetic component winding is an inductor winding.

4. A lead frame as set forth in claim 3 further comprising a magnetic coating material substantially covering said inductor winding so as to form an inductor.

5. A lead frame as set forth in claim 4 wherein said magnetic coating material is an epoxy having magnetic particles dispersed therein.

6. A lead frame as set forth in claim 1 wherein said magnetic component winding has a coil shape.

7. A lead frame as set forth in claim 1 wherein said magnetic component winding has a zig-zag shape.

8. A lead frame as set forth in claim 1 wherein said lead frame unitary main body including said magnetic component winding is formed from a sheet of electrically conductive material.

9. An integrated circuit package comprising;
   (a) an integrated circuit component,
   (b) a lead frame including a unitary main body for supporting said integrated circuit component within said integrated circuit package and an array of electrically conductive leads for electrically connecting said integrated circuit component to other elements, and
   (c) a magnetic component having a winding integrally forming part of the unitary main body of said lead frame.

10. An integrated circuit package as set forth in claim 9 further comprising additional windings integrally formed with and as part of the main body of said lead frame wherein said windings are stacked in parallel planes forming a multiple layered winding.

11. An integrated circuit package as set forth in claim 9 wherein said magnetic component winding is an inductor winding.

12. An integrated circuit package as set forth in claim 11 further comprising a magnetic coating material substantially covering said inductor winding forming said magnetic component.

13. An integrated circuit package as set forth in claim 12 wherein said magnetic coating material is an epoxy having magnetic particles dispersed therein.

14. An integrated circuit package as set forth in claim 9 wherein said magnetic component winding has a coil shape.

15. An integrated circuit package as set forth in claim 9 wherein said magnetic component winding has a zig-zag shape.

* * * * *